United States Patent
Crowley et al.

(10) Patent No.: US 6,707,138 B2
(45) Date of Patent: *Mar. 16, 2004

(54) SEMICONDUCTOR DEVICE INCLUDING METAL STRAP ELECTRICALLY COUPLED BETWEEN SEMICONDUCTOR DIE AND METAL LEADFRAME

(75) Inventors: Sean T. Crowley, Phoenix, AZ (US); Blake A. Gillett, Gilbert, AZ (US); Bradley D. Boland, Mesa, AZ (US); Philip S. Mauri, Cabuyao (PH); Ferdinand E. Belmonte, Laguna (PH); Remigio V. Burro, Jr., San Pedro (PH); Victor M. Aquino, Jr., Marikina (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/256,905

(22) Filed: Sep. 26, 2002

(65) Prior Publication Data

US 2003/0075785 A1 Apr. 24, 2003

Related U.S. Application Data

(63) Continuation of application No. 09/587,136, filed on Jun. 2, 2000, now Pat. No. 6,521,982, and application No. 09/452,545, filed on Dec. 1, 1999, now Pat. No. 6,319,755, and application No. 09/536,236, filed on Mar. 27, 2000, now Pat. No. 6,459,147.

(51) Int. Cl.[7] .................. H01L 23/48; H01L 23/52; H01L 23/34; H01L 23/495; H05K 7/20

(52) U.S. Cl. .............. 257/676; 257/666; 257/692; 257/735; 257/696; 257/698; 257/712; 257/717; 257/673; 257/401; 257/329; 257/139; 257/341; 257/675

(58) Field of Search ............... 257/676, 646, 257/692, 735, 696, 698, 712, 717, 673, 44, 329–335, 139, 341, 675, 680, 668, 796, 774, 728, 690–693

(56) References Cited

U.S. PATENT DOCUMENTS

| 4,189,342 A | 2/1980 | Kock ................ 156/656 |
| 4,546,374 A | 10/1985 | Olsen et al. ............. 357/71 |
| 4,935,803 A | 6/1990 | Kalfus et al. ............ 357/68 |
| 4,942,452 A | 7/1990 | Kitano et al. ............ 357/68 |
| 5,218,231 A | 6/1993 | Kudo ................... 257/753 |

(List continued on next page.)

FOREIGN PATENT DOCUMENTS

| GB | 0720225 A2 | 12/1995 | ............ 23/482 |
| GB | 0720234 A2 | 7/1996 | ............ 29/417 |

(List continued on next page.)

OTHER PUBLICATIONS

Internet Website Article, Electronic Design—Mar. 22, 1999, vol. 47, No. 6– MOSFETs Break Out Of The Shackles Of Wirebonding.

(List continued on next page.)

Primary Examiner—Alexander O. Williams
(74) Attorney, Agent, or Firm—Bever, Hoffman & Harms, LLP; James E. Parsons

(57) ABSTRACT

A semiconductor device is disclosed that includes a semiconductor die, a metal leadframe, and a metal strap. A bottom surface of the semiconductor device is on and electrically coupled to a first portion of the leadframe. A first end portion of the metal strap is on and electrically coupled to a top surface of the semiconductor die. An opposite, second end portion of the metal strap is on and electrically coupled to a second portion of the leadframe within a recess of the second portion of the leadframe.

26 Claims, 4 Drawing Sheets

U.S. PATENT DOCUMENTS

| | | | |
|---|---|---|---|
| 5,266,834 A | 11/1993 | Nishi et al. | 257/706 |
| 5,399,902 A | 3/1995 | Bickford et al. | 257/659 |
| 5,477,160 A | 12/1995 | Love | 324/755 |
| 5,544,412 A | 8/1996 | Romero et al. | 29/832 |
| 5,663,597 A | 9/1997 | Nelson et al. | 257/734 |
| 5,665,996 A | 9/1997 | Williams et al. | 257/401 |
| 5,767,527 A | 6/1998 | Yoneda et al. | 257/48 |
| 5,814,884 A | 9/1998 | Davis et al. | 257/723 |
| 6,005,778 A | 12/1999 | Spielberger et al. | 361/770 |
| 6,040,626 A | 3/2000 | Cheah et al. | 257/735 |
| 6,127,727 A | 10/2000 | Eytcheson | 257/692 |
| 6,144,093 A | 11/2000 | Davis et al. | 257/723 |
| 6,187,611 B1 | 2/2001 | Preston et al. | 438/106 |
| 6,223,429 B1 | 5/2001 | Kaneda et al. | 29/832 |
| 6,249,041 B1 | 6/2001 | Kasem et al. | 257/666 |
| 6,252,300 B1 | 6/2001 | Hsuan et al. | 257/686 |
| 6,255,672 B1 | 7/2001 | Yoshioka et al. | 257/107 |
| 6,256,200 B1 | 7/2001 | Lam et al. | 361/704 |
| 6,319,755 B1 * | 11/2001 | Mauri | 438/119 |
| 6,459,147 B1 * | 10/2002 | Crowley et al. | 257/692 |
| 6,521,982 B1 * | 2/2003 | Crowley et al. | 257/676 |

FOREIGN PATENT DOCUMENTS

| | | | |
|---|---|---|---|
| JP | 60-116239 | 8/1985 | 21/60 |
| JP | 8-64634 | 3/1996 | 21/60 |
| WO | WO 88/02929 | 4/1988 | H01L/23/48 |

OTHER PUBLICATIONS

File Wrapper for Provisional Patent Application No. 60/101810.

http://www.siliconix.com, "New Package Technology Yields Nearly Twofold Improvement Over Previous State-of-the-Art," Vishay Siliconix Press Release, Dec. 9, 1998.

* cited by examiner

SEMICONDUCTOR DEVICE INCLUDING METAL STRAP ELECTRICALLY COUPLED BETWEEN SEMICONDUCTOR DIE AND METAL LEADFRAME

RELATED APPLICATIONS

This application is a continuation of and claims priority to U.S. patent application Ser. No. 09/587,136, filed on Jun. 2, 2000, now U.S. Pat. No. 6,521,982, issued Feb. 18, 2003, and also claims priority to U.S. patent application Ser. No. 09/452,545, filed Dec. 1, 1999, now U.S. Pat. No. 6,319,755, issued Nov. 20, 2001 and U.S. patent application Ser. No. 09/536,236, filed on Mar. 27, 2000, now U.S. Pat. No. 6,459,147, issued on Oct. 1, 2002.

BACKGROUND

1. Technical Field

This invention relates to packaging of semiconductor devices in general, and in particular, to a method and apparatus for reliably connecting the die of a high power semiconductor device, such as a power MOSFET, IGBT, rectifier, or SCR device, to an associated substrate with a conductive strap.

2. Related Art

Some high power semiconductor devices are fabricated by forming a number of individual, lower power devices in a single semiconductor die, or "chip," then connecting the individual devices together in parallel within the package of the device to define a single device capable of higher power output.

Thus, in an exemplary eight-lead, standard outline integrated circuit ("SOIC-8") high-power, metal-oxide-semiconductor field effect transistor ("PMOSFET") device, the sources of the individual devices are all located on the top of the die, and are connected in parallel by a thin layer of metal on the top of the die, which in turn, is internally connected to each of three leads of the device.

In prior art versions of this type of device, the sources of the individual MOSFETs were connected to the substrate of the device by a relatively large number (typically, 14) of parallel bonded wires. However, these wires contributed to a number of problems associated with this type of device, including relatively high internal thermal and electrical resistances, high parasitic source-inductance, and the formation of craters and Kirkendall voids in the die caused by the bonding of the wires.

More recently, it has been learned that most of the foregoing problems can be eliminated or reduced by replacing the large number of bonded wires from the source of the device with a single, elongated conductive strap that connects the thin layer of metal on top of the die to the source leads of the substrate. (See, e.g., U.S. Pat. No. 6,040,626 to C. Cheah, et al.; see also, Patrick Manion, "MOSFETs Break Out Of The Shackles of Wirebonding," *Electronic Design*, Mar. 22, 1999, Vol. 47, No. 6.)

However, this latter method of connecting the die to the substrate has also been found to have some problems associated with it. One of these relates to the differences in the respective thermal coefficients expansion ("TCE") of the materials of the strap, die, and substrate. As a result of these differences, these parts respectively experience different amounts of expansion and contraction with changes in the temperature of the device. This relative movement of the respective parts causes large shear stresses to develop in the attachment joints between them, which are typically lap joints of conductive adhesive or solder. These shear stresses result in a degradation of the electrical connection between the strap, die, and substrate, and in particular, in an unacceptably large change, or "shift," in the critical drain-to-source resistance of the device when it is on ($R_{DS(ON)}$).

A need therefore exists for a method and apparatus for reliably connecting the dies of a variety of high power semiconductor devices to a substrate with a conductive strap such that the electrical connections between the parts are immune to the destructive effects of temperature-induced stresses in the connections.

BRIEF SUMMARY

This invention provides a method and apparatus for packaging a high power semiconductor device, such as a high power MOSFET, an insulated gate bipolar transistor ("IGBT," or "JFET"), a silicon controlled rectifier ("SCR," or "triac"), a bipolar junction transistor ("BJT"), or a diode rectifier, in which the die of the device is connected, electrically and thermally, to a substrate on which the die is mounted, e.g., a lead frame, with a conductive strap, such that the connection is more resistant to the shear stresses incident upon it with changes in temperature of the device. The enhanced reliability of this connection, in turn, enhances overall device reliability and reduces semiconductor device failures due to, e.g., large changes in the device's $R_{DS(ON)}$ parameter.

The method includes the provision of a semiconductor die, an interconnective substrate, and a conductive metal strap. The substrate has a first portion with a first lead connected thereto, and a second portion with a second lead connected thereto. The first and second portions of the substrate are electrically isolated from each other.

The die has top and bottom surfaces and at least one active electronic device, e.g., a MOSFET, an IGBT, a BJT, an SCR, or a rectifier, formed therein. The active device has a first terminal, e.g., a source, emitter, or anode terminal, connected to a first electrically conductive layer on the bottom surface of the die, and a second terminal, e.g., an associated drain, collector, or cathode terminal, connected to a second conductive layer on the top surface of the die. The first conductive layer is attached to a top surface of the first portion of the substrate by a first joint of an electrically conductive material. The device may also have a gate terminal connected to a third conductive layer, or gate pad, on the bottom surface of the die, which is electrically isolated from the first conductive layer thereon. The gate pad is attached to a top surface of an inner end of a third lead that is associated with, but electrically isolated from, the first portion of the substrate and first lead connected thereto.

The conductive strap has a cover portion, a down-set portion at an edge of the cover portion, and a flange portion at an edge of the down-set portion. The cover portion is attached to the second conductive layer on the top surface of the die with a second joint of an electrically conductive material, and the flange portion is attached to a top surface of the second portion of the substrate with a third joint of an electrically conductive material.

In one embodiment, a recess is formed in the top surface of the second portion of the substrate. The recess has a floor disposed below the top surface of the substrate. The recess captivates the flange portion of the strap and prevents movement of the flange relative to the substrate with variations in device temperature.

A better understanding of the above and other features and advantages of the present invention may be obtained from a consideration of the detailed description of its exemplary embodiments found below, particularly if such consideration is made in conjunction with the several views of the drawings appended hereto.

DETAILED DESCRIPTION

Figure 1:
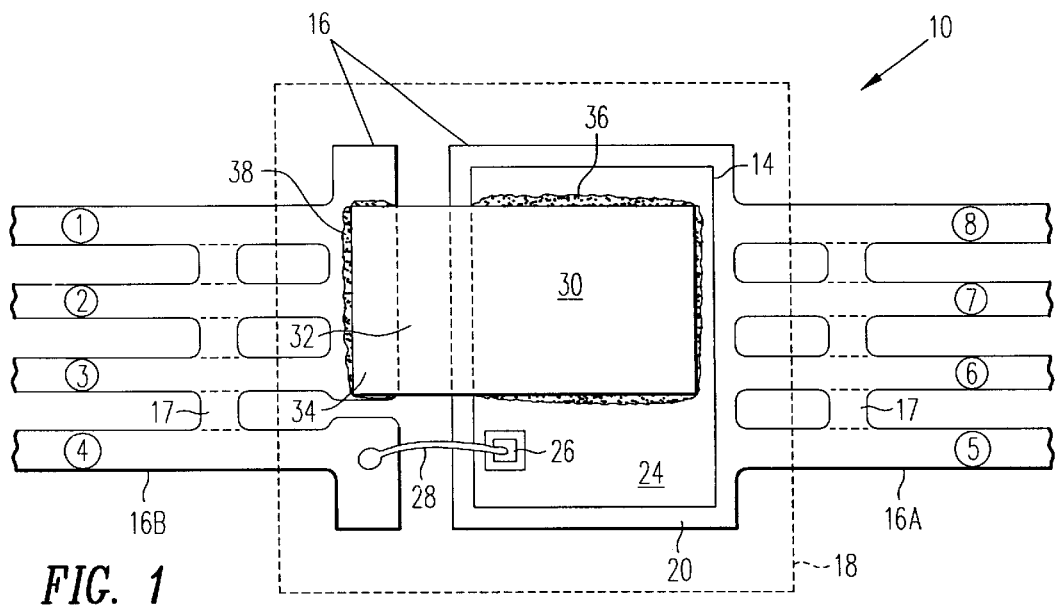
FIGS. 1 and 2 are top plan and side elevation views, respectively, of a lead frame type of high power MOSFET semiconductor device having a conductive strap electrically connecting the die to the substrate in accordance with one of the methods of the prior art.
Figure 2:
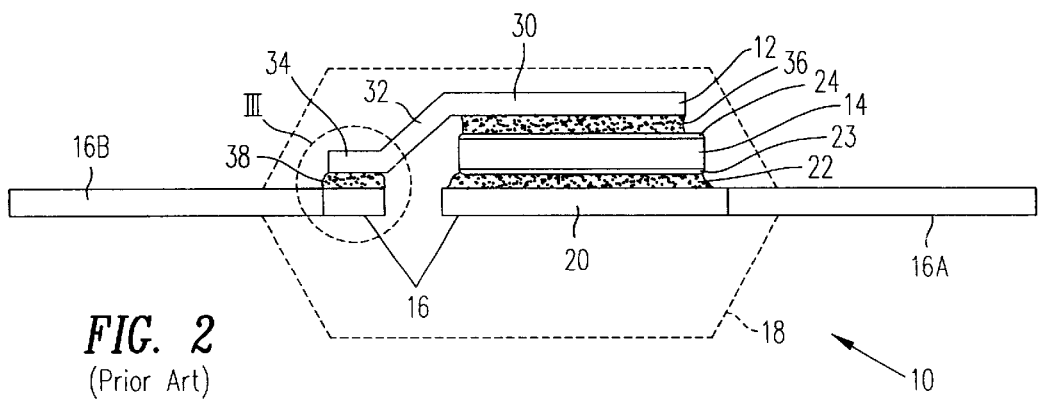

FIGS. 1 and 2 are top plan and side elevation views, respectively, of a eight-lead, lead-frame-type of power MOSFET semiconductor device 10 having a conductive strap 12 electrically connecting the die 14 of the device to a second portion 16B of a lead-frame-type substrate 16 in accordance with the lap-joint strap attachment method of the prior art. The protective plastic body 18 encapsulating the die 14 and substrate 16 of the device 10 is shown in dotted outline to reveal the components encapsulated therein. After encapsulation, the dam bars 17 shown connecting the leads 1–8 of the lead frame 16 together in a planar structure are cut away from the package along the dotted lines shown, and discarded.

In the exemplary prior art PMOSFET device 10 of FIG. 2, the drain terminals of one or more individual MOSFETs (not visualized) formed in the die 14 are connected to a first conductive layer 23 located on the bottom surface of the die. The first conductive layer 23 (see FIG. 2) on the bottom surface of the die 14 is, in turn, attached to the metal die paddle 20 of a first portion 16A of the lead frame 16 by, e.g., a layer 22 of solder or a conductive adhesive. The die paddle 20 is internally connected within the lead frame 16 to each of four leads (leads 5–8) of the device 10.

The source terminals of the one or more individual MOSFETS in the die 14 are connected to a second conductive layer 24 (see FIG. 2) on the top surface of the die. The second conductive layer 24 on the die 14 is electrically connected to three leads (leads 1–3) of the device 10 by the conductive strap 12.

Figure 3:
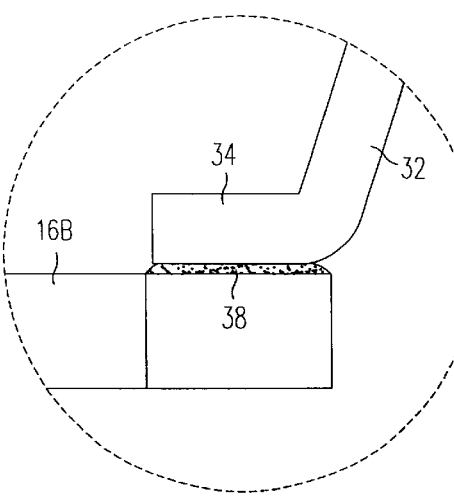
FIG. 3 is an enlarged view of the circled portion III in FIG. 2.

The strap 12 comprises a top, or cover portion 30, an intermediate, down-set portion 32, and a bottom, or flange portion. The flange portion 34 of the strap connects to the second portion 16B of the substrate 16 by a lap joint, which is shown enlarged in FIG. 3. The gate terminals of the individual MOSFETS are connected to a third conductive layer, or gate pad 26, located on the top surface of the die 14. The pad 26, which is electrically isolated from the second conductive layer 24 on the top surface of the die is, in turn, connected to one of the leads (e.g., lead 4 illustrated) of the device 10 by a bonded wire 28 (see FIG. 1).

The conductive strap 12 is made of a conductive metal, typically copper or an alloy thereof. As shown in FIG. 2, the respective bottom surfaces of the cover and flange portions 30, 34 of the strap 12 lap over the respective top surfaces of the die 14 and the second portion 16B of the substrate 16, and are respectively joined thereto with layers 36, 38, of, e.g., solder or a conductive epoxy.

It will be understood that the strap 12 and the die 14, and possibly, the substrate 16, are each fabricated from different materials, and accordingly, have different TCEs. This, in turn, results in large differences in the amount of expansion and contraction undergone by the respective parts with changes in their temperature. As discussed above, this movement of the parts relative to one another with changes in temperature imparts large horizontal shear stresses in the lap joint 36 and 38 between the conductive strap 12, the die 14, and the portions 16A and 16B of the substrate 16, and frequently leads to a degradation or failure of the electrical connection between the strap, the die, and/or the substrate, and/or unacceptably large changes in the device's $R_{DS(ON)}$ parameter.

Figure 4:
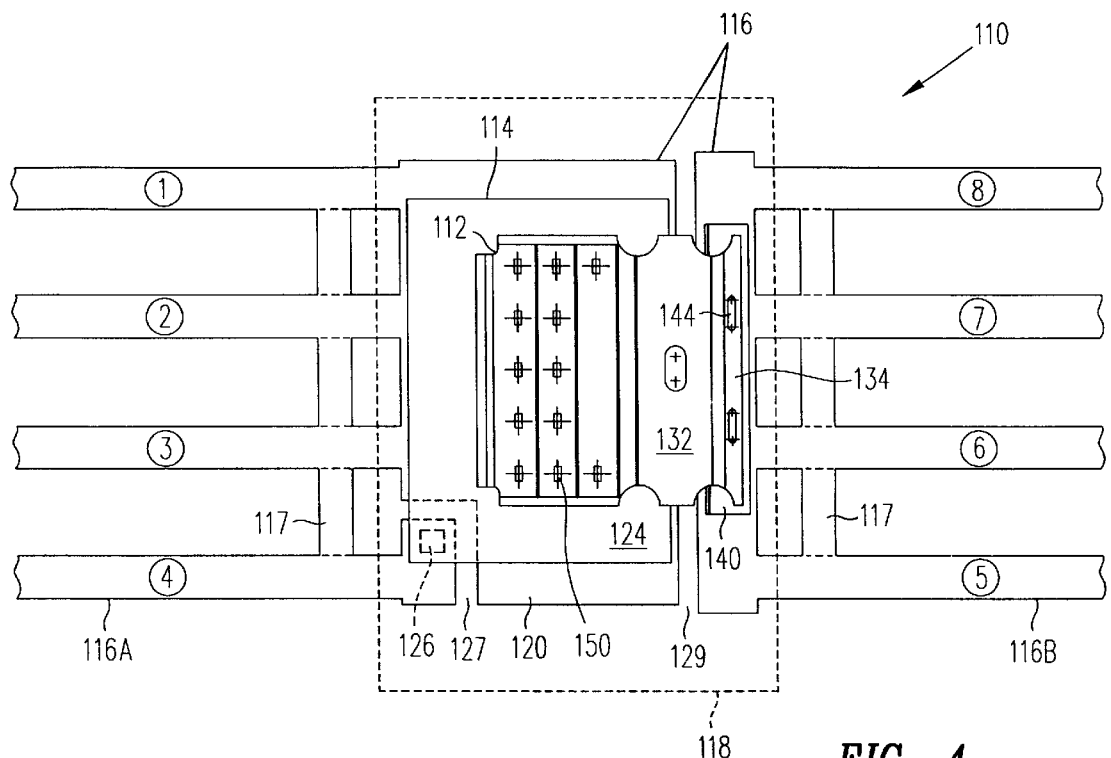
FIGS. 4 and 5 are top plan and side elevation views, respectively, of a semiconductor device having a conductive strap electrically connecting a high power semiconductor die to a substrate in accordance with one exemplary embodiment of the present invention.
Figure 5:
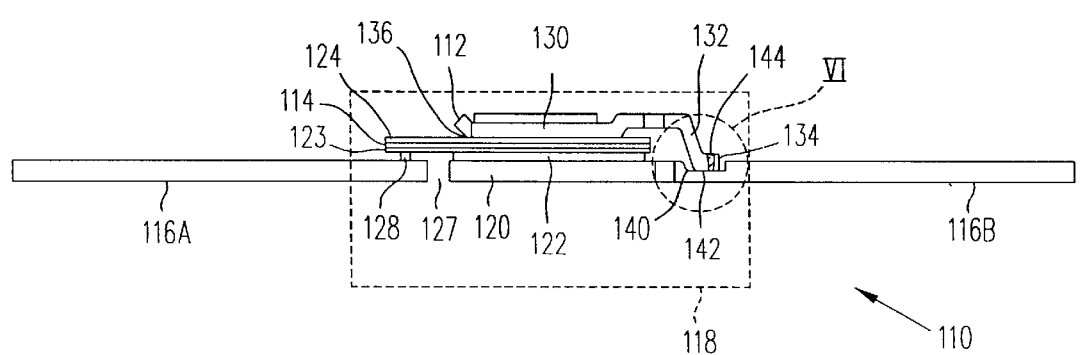

A first exemplary embodiment of a method and apparatus for overcoming the foregoing temperature-induced stress problem is illustrated in the top plan and side elevation views of a high power SOIC-8 device 110 shown in FIGS. 4 and 5, respectively, wherein elements similar to those in the prior art PMOSFET device 10 illustrated in FIGS. 1 and 2 are numbered similarly, plus 100.

Unlike the prior art device 10, however, the active electronic device formed in the die 114 may comprise a device other than a high power MOSFET, and in particular, may comprise, e.g., a high power version of an insulated gate bipolar transistor ("IGBT" or "JFET"), a silicon controlled rectifier ("SCR," or "triac"), a bipolar junction transistor ("BJT"), or a diode rectifier. As in the prior art MOSFET device, the high power version may be implemented by connecting the corresponding terminals of a number of individual, lower-power devices in parallel, which may be effected in the die 114 by forming first and second electrically conductive layers 123, 124, of, e.g., a metal, polysilicon, or conductive ink, on the bottom and top surfaces of the die, respectively (see FIG. 5).

An additional difference between the prior art power device 10 and the device 110 of the present invention relates to the identity of the terminals connected together at the respective top and bottom surfaces of the die 114. In particular, in the various embodiments illustrated and described herein, the source, emitter, or anode terminals of the individual devices are connected together by the first conductive layer 123 formed on the bottom surface of the die 114. The corresponding drain, collector, or cathode terminals, depending on the particular type of power device being fabricated, are connected together by the second conductive layer 124 formed on the top surface of the die 114. The gate terminals, if any, of the individual devices are connected together by a third conductive layer, or gate pad 126, that is formed on the bottom surface of the die 114 and electrically isolated from the first conductive layer 123 thereon. Certain devices 110, e.g., a diode rectifier have no gate terminal or equivalent, and hence, need no third conductive layer on either surface of the die 114. Other devices, e.g., MOSFETs, IGBTs, BJTs, and SCRs do include a third, gate terminal, which must be electrically isolated from the other terminals of the device. Typically, the gate terminal is used as a control terminal of the device, and hence, is not required to carry as great a current level as the other terminals.

The first conductive layer 123 on the bottom surface of the die 114, excluding the third, or gate, conductive layer 126 thereon, is attached to the top surface of a first portion 116A of the substrate 116, e.g., to the conductive die paddle 120 of a lead frame, to which one or more first conductive leads (leads 1–3 in the embodiment illustrated) are connected. The gate pad 126, if any, is connected to a top surface of the inner end of a third lead, e.g., lead 4 illustrated in FIGS. 4 and 5, that is coplanar with, but electrically isolated from, the first lead(s) 1–3 by a cutout 127 in the die paddle 120 of the lead frame 116.

Both the first and third conductive layers 123 and 126 on the bottom surface of the die 114 can be attached and electrically connected to their respective attachment surfaces on the first portion 116A of the substrate 116 with a variety of electrically conductive materials, including soft solder, a conductive adhesive, or a conductive elastomer. In the embodiment illustrated, the third, or gate, conductive layer 126 is attached to the top surface of the inner end of lead 4 with a ball of solder 127, using the so-called "flip chip," or "C4," attachment and connection method, thereby eliminating the need for the wire bond 28 of the prior art MOSFET device 10. The conductive layer 123 on the bottom surface of the die 114 is attached to the top surface of the conductive die paddle 120 in a manner similar to the C4, or flip chip, method, except that a layer of solder 122, or a paste of solder and flux, is substituted for the ball of solder typically used between corresponding pads in the latter method.

The drain, collector, or cathode terminal(s) of the device 110, which are connected to each other by the second conductive layer 124 on the top surface of the die 114, are connected to the substrate 116 by the conductive strap 112. The conductive strap 112 is similar to that found in the prior art device 10, and may be formed from a sheet of copper or an alloy thereof.

The strap 112 comprises a planar cover portion 130 that has a bottom surface adapted to attach to the top surface of the die 114 with, e.g., a layer 136 of soft solder or a conductive adhesive. An oblique, down-set portion 132 of the strap 112 is formed at an edge of the cover portion 130, and transitions laterally downward from the cover portion to the level of the substrate 116. A flange portion 134 is formed at the lower edge of the down-set portion 132, and has a bottom surface adapted to attach to the second portion 116B of the substrate 116, which is electrically isolated from the first portion 116A thereof by a second gap 129 in the substrate. The second portion 116B has one or more second leads connected to it (leads 5–8 in the embodiment illustrated) that are coplanar with the first (leads 1–3) and third lead (lead 4) respectively connected to or associated with the first portion 116A of the substrate 116, as described above.

In an alternative embodiment of the high power device 110 (not illustrated), the substrate 116 may comprise a single-piece, laminated substrate, such as a multi-layer printed circuit board ("PCB"), formed of layers of, e.g., epoxy-impregnated fiberglass and copper, with etched conductive traces replacing the leads of the lead frame substrate 16 illustrated in the figures.

Figure 6:
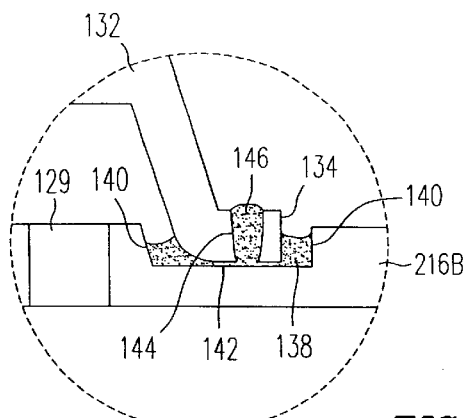
FIG. 6 is an enlarged view of the circled portion VI in FIG. 5.

As shown in the circled portion VI in FIG. 5, the first embodiment of the method comprises forming a recess 140 in the top surface of the second portion 116B of the substrate 116. In the enlarged view of the circled portion VI shown in FIG. 6, the recess 140 has an area that is slightly larger than that of the flange portion 134 of the conductive strap 112, and a floor 142 disposed below the top surface of the substrate 116. The flange portion 134 of the strap 112 is inserted into the recess 140, and its bottom surface is attached to the floor 142 of the recess by, e.g., a joint 138 of solder or a conductive adhesive, such as a silver-filled epoxy resin or elastomer. The recess 140 thus mechanically captivates the flange portion 134 of the conductive strap 112 so that horizontal movement of the flange portion relative to the substrate 116, such as would occur with a large changes in temperature of the parts, is prevented, thereby reinforcing the joint 138 against the shear stresses acting on it.

The resistance of the joint 138 to shear stresses can be further augmented by forming slots, or apertures 144, through the flange portion 134 of the strap 112 such that the adhesive or solder of the attachment joint 138 flows into the apertures and forms mechanically interlocking "keys" 146 therein when it solidifies. In a similar manner, the resistance to shear stresses of the conductive joint 136 between the cover portion 130 of the strap 112 and the top surface of the die 114 can also be enhanced by forming slots, or apertures 150 in the cover portion of the strap. The apertures 144 and 150 can advantageously be formed to taper toward the bottom surface of the flange portion 134 to enhance this interlocking effect of the keys 146.

Both the recess 140 in the substrate 116 and the optional apertures 144, 150 of the connection strap 112 can be formed with a wide variety of known techniques, including photolithography and etching, electrical-discharge machining ("EDM"), stamping, punching, coining, or laser-burning.

Figure 7:
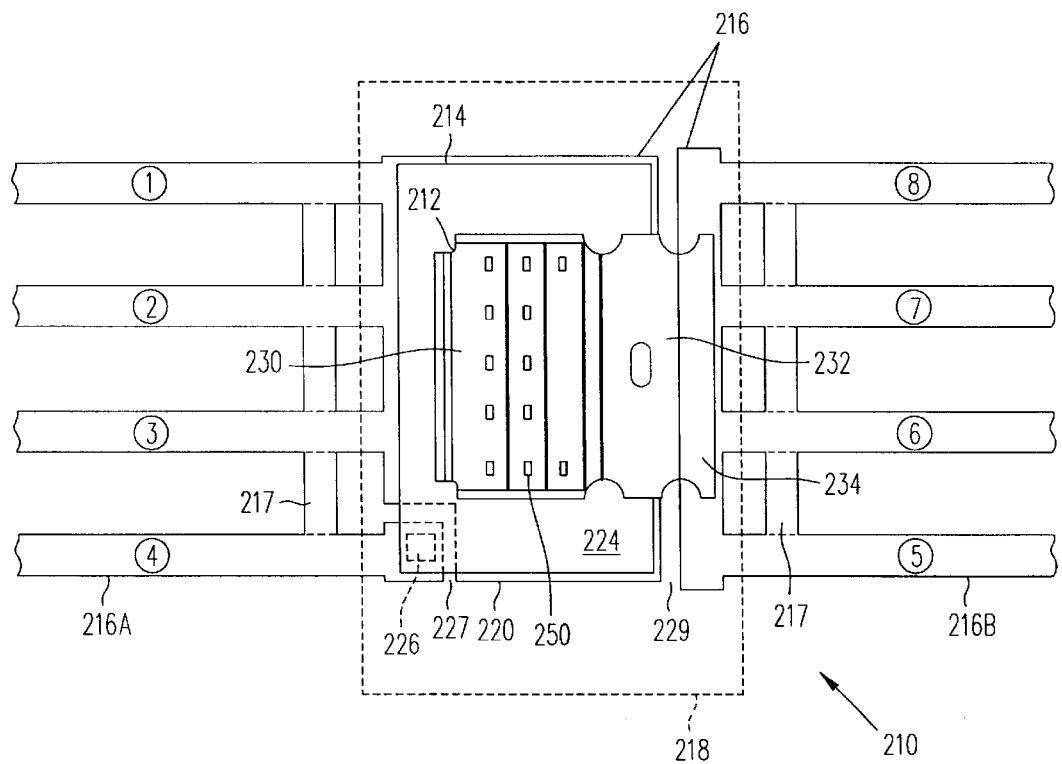
FIGS. 7 and 8 are top plan and side elevation views, respectively, of a semiconductor device having a conductive strap electrically connecting the die to the substrate in accordance with another embodiment of the present invention.
Figure 8:
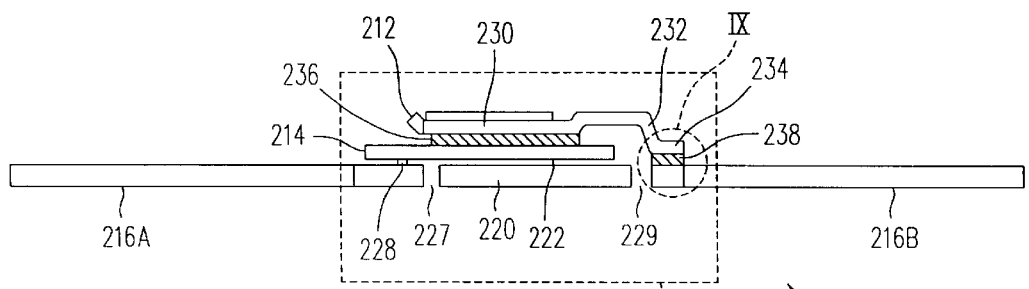

A second exemplary embodiment of a method for connecting the die 214 of a high power semiconductor device 210 to a planar substrate 216 while avoiding the temperature-induced stress problem in the connection is illustrated in the top plan and side elevation views of a high power SOIC-8 device 210 shown in FIGS. 7 and 8, respectively, wherein elements similar to those in FIGS. 4 and 5 are numbered similarly, plus 100.

Figure 9:
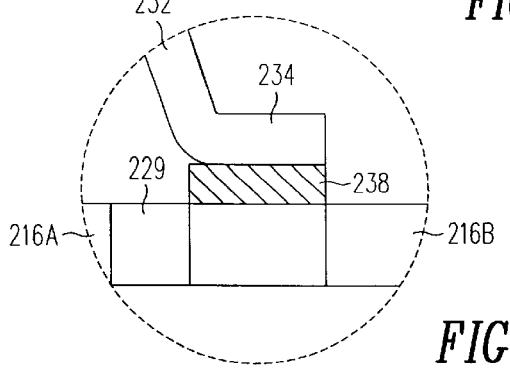
FIG. 9 is an enlarged view of the circled portion IX in FIG. 8.

In the second exemplary embodiment of the device 210, first and second layers of a high-electrically-conductive elastomer 236 and 238 are attached to the respective top surfaces of the die 214 and the second portion 216B of the substrate 216 (see FIG. 8). The bottom surface of the cover portion 230 of the strap 212 is attached to the top surface of the first layer 236 of conductive elastomer on the die 214, and the bottom surface of the flange portion 234 of the strap 212 is attached to the top surface of the second layer 238 of conductive elastomer, thereby connecting the drain, collector, or cathode terminal of the device 210 to the second portion of the substrate 116B, and the leads 5–8 connected thereto. The detail of the latter joint 238 is shown enclosed in the circled portion IX in FIG. 8, and an enlarged view thereof is shown in FIG. 9.

The conductive elastomer layers 236 and 238, which may comprise a silicone rubber filled with silver micro-spheres, thus define a pair of resiliently flexible but electrically conductive joints between the strap 212, the die 214, and the second portion 216B of the substrate 216 that merely stretch in response to incident temperature-induced shear stresses. As a result, the strap 212, the die 214 and the substrate 216 are all free to move relative to one another while remaining firmly connected to each other both electrically and thermally.

This freedom of relative movement of the parts can be further enhanced by attaching a third layer 222 of a conductive elastomer to the top surface of the first portion 216A of the substrate 216, e.g., to the die paddle 220 of the lead frame illustrated, and then attaching the bottom surface of the die 214 to the top surface of the third elastomer layer, thereby connecting the source, emitter, or anode terminal(s) of the die 214 to the first portion 216A of the substrate, and the leads 1–3 connected thereto. The third conductive layer, or gate pad 226, of the device, if any, can be similarly connected to the top surface of the inner end of the third lead (lead 4 in the embodiment illustrated) with a fourth layer 228 of a conductive elastomer.

The conductive elastomer layers, or joints 222, 236, 238, and 228, can be formed in a variety of ways. In one embodiment that can be effected with automated dispensing and pick-and-place equipment, a conductive elastomer compound in the form of an uncured, viscous fluid is applied by a dispenser to one of the two surfaces of each of the three pairs of corresponding interfacial surfaces of the strap 212, the die 214, and the substrate 216, respectively. The other corresponding interfacial surfaces of the respective parts are then brought into contact with the uncured compound, which is then cured to solidify it and adhere the respective parts in electrical connection with each other.

In another embodiment, the elastomer connection layers 222, 236, 238, and 228 can be provided in the form of fully cured strips that are simply adhered to the respective interfacial surfaces of the strap 212, die 214 and substrate 216 with, e.g., a conductive epoxy resin.

In yet another embodiment, the elastomer layers 222, 236, 238, and 228 can be provided in the form of cured strips, as above. However, rather than bonding the strips to the respective interfacial surfaces of the strap 212, die 214 and substrate 216 with a conductive adhesive, the latter parts are instead heated, e.g., with an ultrasonic bonder that heats the parts by "scrubbing" them with a finger vibrated at ultrasonic frequencies, and then brought into contact with the surface of the elastomer strips, causing the surfaces of the strips to melt. The molten elastomer is then cooled, causing it to adhere to the respective interfacial surfaces of the strap 212, die 214, and substrate 216, and thereby connect them together with resilient, electrically conductive joints.

Figure 10:
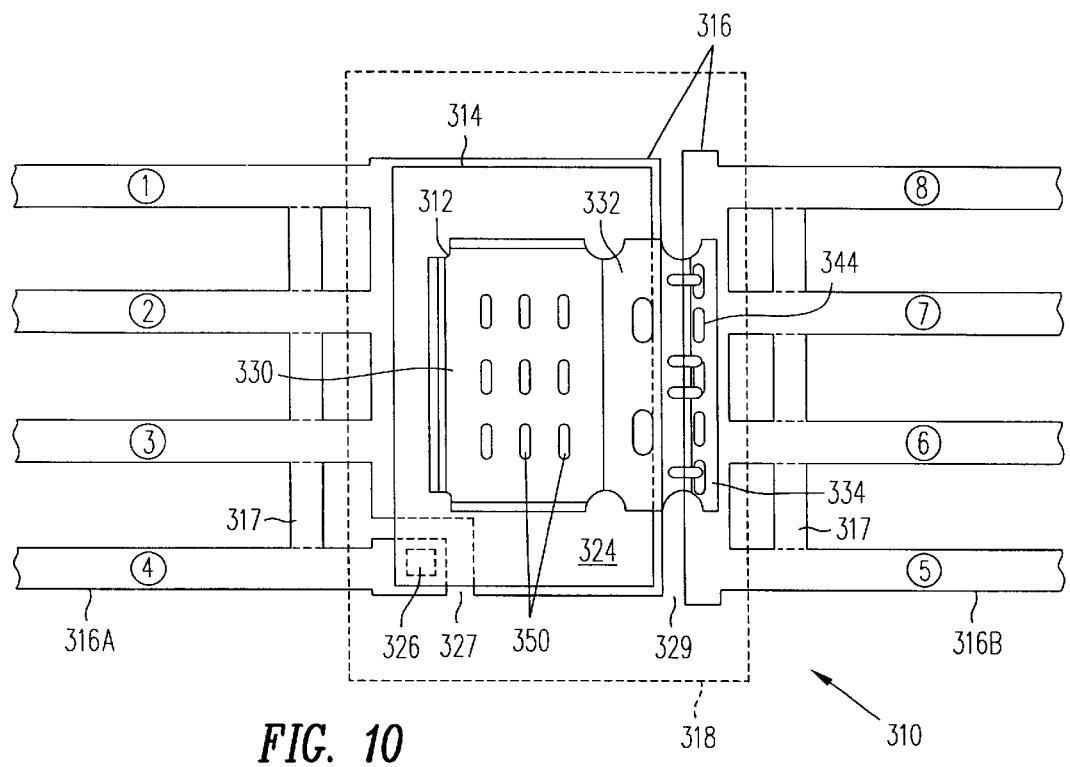
FIGS. 10 and 11 are top plan and side elevation views, respectively, of a semiconductor device having a conductive strap electrically connecting the die to the substrate in accordance with another embodiment of the present invention; and, FIG. 12 is an enlarged view of the circled portion XII in FIG. 11.
Figure 11:
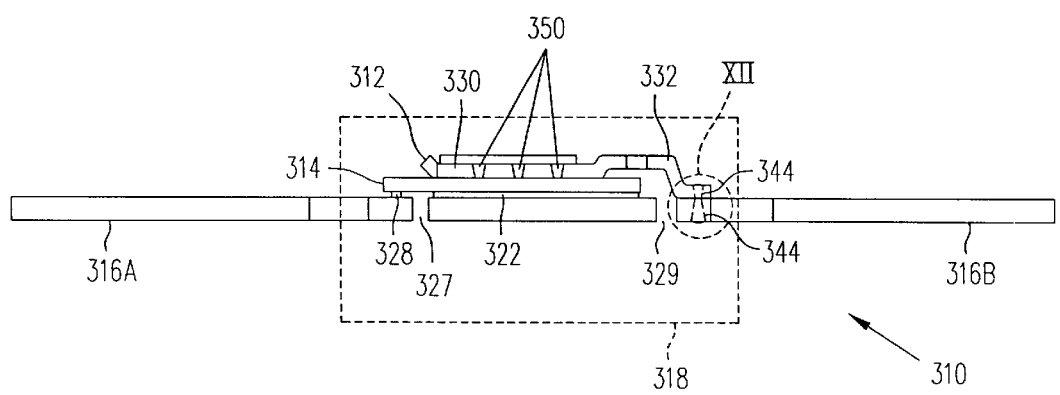

A third exemplary embodiment of a method and apparatus for connecting the die 314 of a high power semiconductor device 310 to a planar substrate 316 while avoiding a temperature-induced stress problem in the connection is illustrated in the top plan and side elevation views of the SOIC-8 device 310 shown in FIGS. 10 and 11, respectively, wherein elements similar to those in FIGS. 7 and 8 are numbered similarly, plus 100.

The third exemplary embodiment comprises forming pairs of corresponding apertures 344 through respective ones of the flange portion 334 of the strap 312 and the substrate 316, and forming a second set of single apertures 350 through the cover portion 330 of the connection strap 312. The bottom surface of the cover portion 330 of the strap 312 is then attached to the second conductive layer 324 on the top surface of the die 314 and the bottom surface of the flange portion 334 of the strap 312 is attached to the top surface of the second portion 116B of the substrate 316 with a respective joint 336, 338 of an electrically conductive material, e.g., solder or a conductive epoxy, such that respective ones of the first set of corresponding apertures 344 are aligned with each other, and such that the conductive material of the joint 336, 338 flows into each of the apertures 344, 350 in the respective two sets thereof and forms an interlocking key 346 therein when it is cured.

Figure 12:
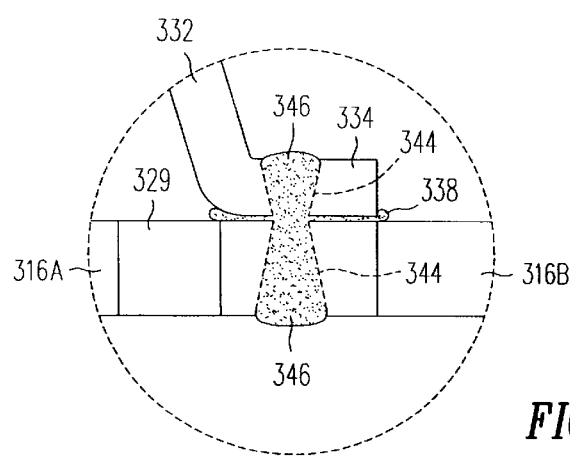

A pair of the first set of corresponding apertures 344 and their associated interlocking keys 346 are shown in the circled portion XII in FIG. 11, and in the enlarged view thereof in FIG. 12. As shown in FIG. 12, and as described above in connection with the first embodiment 110, the mechanical resistance of the connection joints 336, 338 between the strap 312 and the substrate 316 to temperature-induced shear stresses can be further enhanced by tapering respective ones of the first set of corresponding apertures 344 toward the bottom surface of the flange portion and the top surface of the substrate, respectively. Similarly, the mechanical resistance of the connection joint 336 between the strap 312 and the die 314 to temperature-induced shear stresses can be further enhanced by tapering the second set of apertures 350 toward the bottom surface of the cover portion 330 of the strap.

The apertures 344, 350 can be circular, or elongated slots, as illustrated in the figures, and they can be formed by a variety of methods, e.g., by photo-etching, EDM, punching, stamping, or ablative laser-burning. In the case of an etched metal lead frame type of substrate 316 such as that shown in the figures, the apertures 344, 350 can be efficiently etched at the same time the lead frame is etched from the parent stock. Further, the bond strength of the plastic body 318 molded on the device 310 can be enhanced by roughening the surfaces of the strap 312 and the substrate 316, which can also be effected by an etching process.

As discussed above, after the die 314 is mounted and connected to the substrate 316, the die and substrate are "overmolded" with a dense plastic body 318 that protects components from harmful environmental elements, particularly moisture. Since the packaged device of the invention completely eliminates the wire bonding of the prior art high power devices, the problem of "wire sweep" during the molding operation is also completely eliminated.

After molding, the leads of a lead-frame-type substrate 116 are trimmed and formed, the dam bars 317 are punched out, and the body 317 is marked, e.g., with a laser. In a laminated type of substrate 116, the finishing operation may include the attachment of solder balls (not illustrated), which, in the case of a ball grid array ("BGA") type of device, function as input/output terminals of the device.

Many variations and modifications can be made in the materials and methods of this invention without departing from its true scope and spirit. For example, the method of the invention is fully compatible with the techniques of high volume device production in which a plurality of identical devices are fabricated simultaneously in the form of a connected strip or array of packages that is subsequently encapsulated, and then cut apart, or "singulated," into individual devices. Accordingly, the scope of the invention should not be limited to that of the particular embodiments illustrated and described herein, as they are merely exemplary in nature, but rather, should encompass that of the claims appended hereafter and their substantial equivalents.

What is claimed is:

1. A semiconductor device comprising:
   a metal leadframe comprising a first portion, a second portion electrically isolated from the first portion, and a third portion electrically isolated from the first and second portions;
   a semiconductor die having opposed top and bottom surfaces, a first terminal connected to a first conductive layer on the bottom surface of the die, a second terminal connected to a second conductive layer on the top surface of the die, and a third terminal connected to a third conductive layer of the die; and,
   a metal strap having opposed first and second end portions,
   wherein the first conductive layer is electrically coupled to the first portion of the leadframe with a first joint of an electrically conductive material, the first end portion of the strap is electrically coupled to the second conductive layer with a second joint of an electrically conductive material, the second end portion of the strap is electrically coupled to the second portion of the leadframe with a third joint of an electrically conductive material, and the third conductive layer on the die is electrically coupled to the third portion of the leadframe, and
   wherein the second portion of the leadframe has a recess formed by a removal of metal from the second portion of the leadframe, and the second end portion of the metal strap is captivated within the recess.

2. The semiconductor device of claim 1, wherein the first end portion of the metal strap has at least one aperture therein, and wherein the electrically conductive material of the second joint fills the at least one aperture.

3. The semiconductor device of claim 1, wherein the second end portion of the strap has at least one aperture therein, and the electrically conductive material of the third joint fills the at least one aperture.

4. The semiconductor device of claim 1, wherein:
   the semiconductor die comprises a MOSFET, an IGBT, a BJT, or an SCR;
   the first terminal comprises a source of the MOSFET or the IGBT, an emitter of the BJT, or an anode of the SCR;
   the second terminal comprises a drain of the MOSFET or the IGBT, a collector of the BJT, or a cathode of the SCR; and,
   the third terminal comprises a gate.

5. The semiconductor device of claim 1, wherein the third conductive layer is at the top surface of the semiconductor die, and further comprising a wire coupled between the third conductive layer and the third portion of the leadframe.

6. The semiconductor device of claim 1, wherein the third terminal is a gate, and further comprising a wire coupled to the third conductive layer.

7. The semiconductor device of claim 1, wherein the third conductive layer is on the bottom surface of the die.

8. The semiconductor package of claim 7, wherein the third conductive layer is electrically coupled to the third portion of the leadframe by a fourth joint of an electrically conductive material.

9. The semiconductor package of claim 8, wherein the third terminal is a gate.

10. The semiconductor package of claim 7, wherein the third terminal is a gate.

11. The semiconductor package of claim 1, wherein the second end portion of the strap terminates in a planar flange, and said planar flange is in said recess.

12. The semiconductor package of claim 1, wherein the recess includes a planar floor.

13. The semiconductor package of claim 1, wherein the recess includes a planar floor.

14. A semiconductor device comprising:
    a metal leadframe comprising a planar first portion, and a planar second portion electrically isolated from the first portion;
    a semiconductor die having opposed top and bottom surfaces; and,
    a metal strap having opposed first and second end portions,
    wherein the bottom surface of the semiconductor die is electrically coupled to the first portion of the leadframe, the first end portion of the strap is electrically coupled to the top surface of the semiconductor die, and the second end portion of the strap is electrically coupled to the second portion of the leadframe, and
    wherein the planar second portion of the leadframe has planar surface including a recess from which metal has been removed, and the second end portion of the metal strap is captivated within the recess.

15. The semiconductor device of claim 14, wherein the second end portion of the strap has at least one aperture through it, and an electrically conductive bonding material fills the at least one aperture.

16. The semiconductor device of claim 14, further comprising a wire bond coupled to the top surface of the semiconductor die and to a planar third portion of the leadframe, said third portion being electrically isolated from the first and second portions.

17. The semiconductor package of claim 14, wherein the second end portion of the strap terminates in a planar flange, and said planar flange is in said recess.

18. The semiconductor package of claim 17, wherein the recess includes a planar floor.

19. The semiconductor package of claim 14, wherein the recess includes a planar floor.

20. A semiconductor device comprising:
    a substrate having a first portion with a first lead connected thereto, a second portion electrically isolated from the first portion and having a second lead connected thereto, and a third portion electrically isolated from the first and second portions;
    a semiconductor die having top and bottom surfaces and an active electronic device formed therein, the device having a first terminal connected to a first conductive layer on the bottom surface of the die, a second terminal connected to a second conductive layer on the top surface of the die, and a third terminal connected to a third conductive layer of the die and,
    a metal strap having a cover portion, a flange portion, and a down-set portion between the cover and flange portions, the first conductive layer on the die being attached to a top surface of the first portion of the substrate with a first joint of an electrically conductive material, the cover portion of the strap being attached to the second conductive layer on the die with a second joint of an electrically conductive material, the flange portion of the strap being attached to a top surface of the second portion of the substrate with a third joint of an electrically conductive material, and the third conductive layer of the die being electrically coupled to the third portion of the substrate;
    wherein the top surface of the second portion of the substrate has a recess therein, said recess having a flat bottom, and wherein the flange portion of the metal strap is captivated within the recess.

21. The semiconductor device of claim 1, wherein the metal leadframe further comprises a plurality of leads, with at least a respective one of the leads being integrally coupled to the first, second, and third portions of the leadframe, respectively, and the semiconductor device further comprises a body of a plastic encapsulant material covering the semiconductor die, the metal strap, and the first, second, and third portions of the leadframe, with the leads of the leadframe being exposed outward of the body of the plastic encapsulant material.

22. A semiconductor device comprising:

a metal leadframe comprising a first portion, a second portion electrically isolated from the first portion, and a third portion electrically isolated from the first and second portions, and a plurality of leads, with at least a respective one of the leads coupled to the first, second, and third portions of the leadframe;

a semiconductor die having opposed first and second surfaces; and, a metal strap having opposed first and second end portions, wherein the first surface of the semiconductor die is electrically coupled to the first portion of the leadframe, the first end portion of the strap is electrically coupled to the second surface of the semiconductor die, the second end portion of the strap is electrically coupled to the second portion of the leadframe, and the third portion of the leadframe is electrically coupled to the second surface of the semiconductor die, and wherein the second portion of the leadframe has a planar first surface, a planar second surface opposite the planar first surface, and a recess extending into the second portion of the leadframe only part of a distance between the planar first surface and the planar second surface, and the second end portion of the metal strap is captivated within the recess.

23. A semiconductor device comprising:

a substrate including a first portion and a second portion electrically isolated from the first portion, wherein the second portion of the substrate has a planar first surface, a planar second surface opposite and parallel to the first surface, and a recess extending through the first surface;

a semiconductor die having a first side and a second side opposite the first side; and, a metal strap having opposed first and second end portions, wherein the first side of the semiconductor die is coupled to the first portion of the substrate, the first end portion of the strap is on and electrically coupled to the second side of the semiconductor die, and the second end portion of the strap is captivated within the recess and is electrically coupled to the second portion of the substrate within the recess.

24. The semiconductor device of claim 23, wherein the recess has a planar floor, and a planar surface of the second end portion of the metal strap is attached to the planar floor.

25. The semiconductor device of claim 23, further comprising a wire electrically coupled between the second side of the semiconductor die and a third portion of the substrate, the third portion being electrically isolated from the first and second portions of the substrate.

26. The semiconductor device of claim 23, further comprising a body of plastic encapsulant over the semiconductor die, the substrate, and the metal strap, wherein the substrate is a metal leadframe, and the first and second portions of the substrate each include at least one integral lead, said at least one integral lead including a portion exposed outward of the body of plastic encapsulant.

* * * * *